United States Patent [19]

Upadhya

[11] Patent Number: 4,956,858
[45] Date of Patent: Sep. 11, 1990

[54] METHOD OF PRODUCING LUBRICATED BEARINGS

[75] Inventor: Kamleshwar Upadhya, Glendale, Wis.

[73] Assignee: General Electric Company, Milwaukee, Wis.

[21] Appl. No.: 313,182

[22] Filed: Feb. 21, 1989

[51] Int. Cl.$^5$ .................. H01J 35/10; H01J 35/26
[52] U.S. Cl. ............................. 378/133; 378/132; 384/625
[58] Field of Search ............. 378/132, 133; 384/625

[56] References Cited

U.S. PATENT DOCUMENTS

| 4,097,759 | 6/1978 | Furbee et al. | 313/60 |
| 4,097,760 | 6/1978 | Cinelli | 378/133 |
| 4,293,171 | 10/1981 | Kakumoto et al. | 384/625 |
| 4,490,264 | 12/1984 | Gerkeman et al. | 252/12 |
| 4,508,396 | 4/1985 | Doi et al. | 384/492 |
| 4,569,070 | 2/1986 | Schubert | 378/132 |
| 4,821,385 | 4/1989 | Ueno et al. | 384/492 |

FOREIGN PATENT DOCUMENTS

| 0198046 | 10/1985 | Japan | 378/133 |
| 0211750 | 10/1985 | Japan | 378/133 |

Primary Examiner—Craig E. Church
Assistant Examiner—John C. Freeman
Attorney, Agent, or Firm—Quarles & Brady

[57] ABSTRACT

A method of applying solid lubricant to a bearing with rolling surfaces which comprises the steps of sputter cleaning the bearing substrate and implanting ions of the solid lubricant to a shallow depth in the surface of the substrate to improve the bonding of the solid lubricant plating which is subsequently deposited by plasma-assisted ion plating in a thin layer of approximately 1000 Å directly over the implanted substrate and wherein the plating is applied to the bearing substrate at high temperature and in the presence of low pressure inert gas ions to improve surface structure and wherein the bearing element is then cooled in a vacuum.

3 Claims, 4 Drawing Sheets

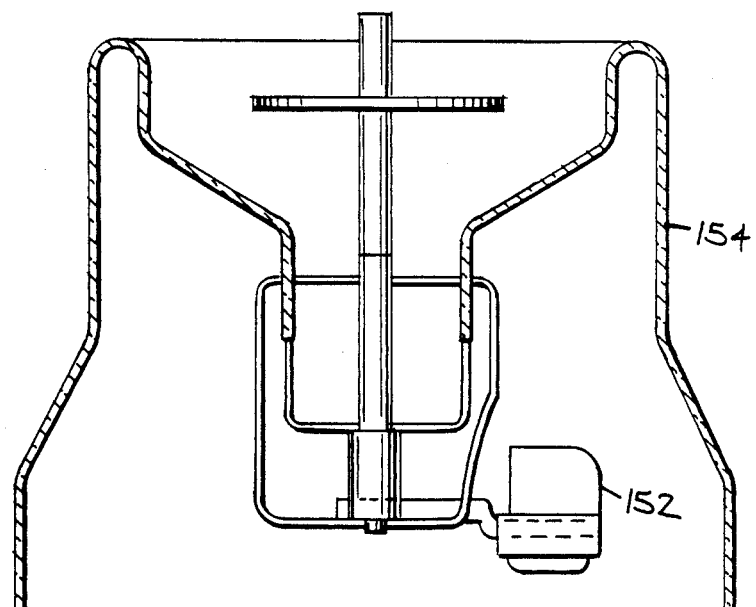
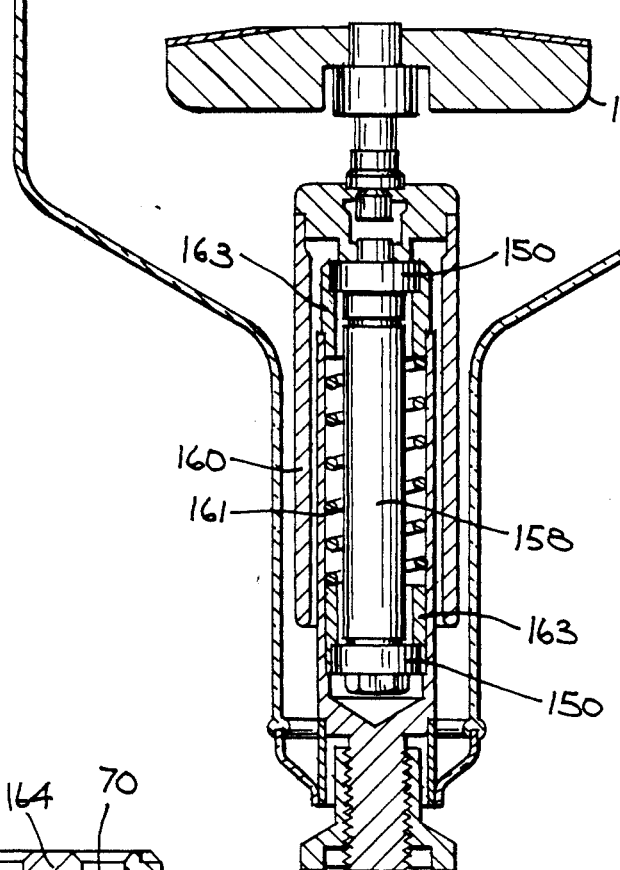
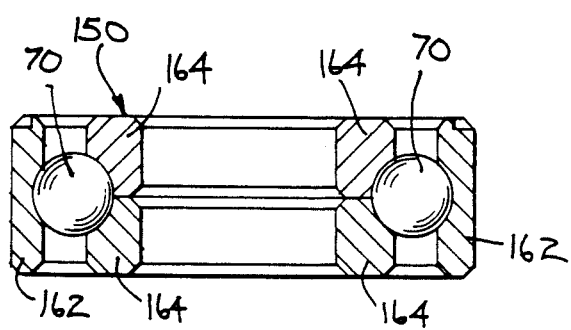
FIG. 6
FIG. 7

METHOD OF PRODUCING LUBRICATED BEARINGS

BACKGROUND OF THE INVENTION

This invention relates to a method of producing bearings with integral solid-lubrication and more particularly to bearings for use in harsh environments, such as those encountered in an X-ray tube, where organic lubricating agents would be unacceptable.

A principal component of conventional X-ray equipment and computed tomography (CT) equipment is an X-ray tube which provides the source of X-rays. Such tubes contain a vacuum at $10^{-8}$ to $10^{-9}$ torr and operate by accelerating a stream of electrons from a heated cathode through a high voltage against a target anode. The conversion efficiencies of such tubes are low and therefore considerable heat is generated in the anode as a by-product of the x-rays generation.

In order to reduce heat concentration in the anode, the anode is rotated at speeds up to 10,000 RPM thereby continuously presenting the cathode a new and cooler surface. In a high performance x-ray tube, the surface of the anode may reach temperatures of 3200° C., and areas of the anode outside the immediate target surface may rise to temperatures of approximately 1300° C.

Much of the heat generated in the anode is radiated through the glass walls of the tube from high emissivity anode coatings. Even so, the anode support structure, including the support bearings on which it rotates, may rise to temperatures of up to 450° C. It should be noted that the anode support structure, including the bearings, are contained within the evacuated x-ray tube envelope.

The combined effect of high rotational speed, high operating temperatures and a vacuum environment place severe demands on the anode support bearings. Bearing failure is consequently the chief limit to x-ray tube life. Such failure may be either from bearing "weld", a seizure of the rolling elements of the bearing within their race from lack of sufficient lubrication, or from bearing noise which may necessitate tube replacement despite otherwise acceptable operation. Bearing noise is thought to arise from surface irregularities in the bearings and from particulate matter within the race, either foreign substances incorporated into the bearing during the bearing manufacture or particles shed from the the bearings themselves.

The extreme operating temperature of x-ray tubes and their internal evacuated environment precludes the use of conventional organic lubrications on x-ray tube bearings. In this application, organic lubricants would rapidly decompose or evaporate. The industry has therefore directed its attentions to solid lubricants for use with such bearings including metals such as such as lead, silver and gold, and various non-metals such as molybdenum disulfide and niobium disalinide.

The use of metals, in particular silver, as lubricants presents the problem of coating the bearing substrate with lubricant so as to prevent delamination of the lubricant from the bearing substrate under operating conditions. The low adherence that makes silver a good lubricant in tool steel bearings causes it to resist bonding to the bearing elements.

This problem of lubricant adhesion has been addressed in the prior art by the use of intermediary, multiple plated layers of different materials to enhance the bonding between the steel bearing part and the lubricating coating. Progressive electroplated layers of nickel, copper and silver heated to allow mutual diffusion are disclosed in U.S. Pat. No. 4,508,396 entitled: "Method of Producing Bearing Component" issued Apr. 2, 1985. The drawbacks to this approach are that additional steps are required for the multiple electroplating operations and the surface produced by the electroplating is relatively rough and of poor structure. The variations in thickness of each of the multiple layers may also aggregate to distort the profile of the final bearing surface Adhesion between the solid lubricant and the bearing substrate may be increased alternatively by the use of abrasives or etchants to roughen the bearing surface thereby increasing the bonding surface area presented to the lubricant. Such roughening, however, works against the ultimate goal of producing a smooth lubricant layer and may necessitate additional plating thickness to improve the ultimate surface finish. As will be described below, it is believed that increased lubrication layer thickness may decrease the lubricating effect of the layer. Further, when the roughening is performed by abrasive blasting, abrasive particles may remain affixed to the bearing, damaging the lubrication layer or becoming unattached thus increasing tube noise and shortening bearing life.

SUMMARY OF THE INVENTION

The present invention uses a three stage lubricant coating process consisting of a sputtering stage which cleans the bearing material, a shallow implantation stage which serves to improve the bonding of the lubricant material to the bearing substrate, and a plasma assisted ion plating stage which applies a thin coating of solid lubricant directly to the bearing. The timing of each stage, the temperature of the bearing, the atmosphere surrounding the bearing, and the ultimate thickness of the lubricant layer are critical to preserving the lubricity, or low coefficient of friction, and durability of the lubricant and will be described in detail in the description of the preferred embodiment.

It is a general object of the invention to provide a means for applying solid lubricants to a dissimilar substrate without increasing surface roughness of the substrate or decreasing sphericity or other dimensional aspects of the final bearing surface. The ion plating process permits the application of a thinner and more uniform lubricant layer than may be produced by techniques such as electroplating or burnishing Ion plating also produces a smoother surface finish. The bonding of an ion plating layer directly to the steel substrate is accomplished by shallow ion implantation which improves the bonding properties of the substrate. This direct application of the solid lubricant layer to the bearing substrate eliminates the need for intermediate layers of transition materials to promote bonding and thus eliminates the thickness variations and roughness from such layers.

Another object of the invention is to reduce the expense of applying solid lubricants. The sputtering and ion-implantation stages may be performed immediately prior to the plating stage and with the same equipment. The use of ion plating and the application of extremely thin layers of the lubrication material, less than 1000Å, reduces the cost of the expensive lubrication materials in usage and in waste. Elimination of the need for transition layers to promote lubricant bonding also reduces the processing costs of the bearings.

A further object of the invention is to reduce the exfoliation of lubricant particles from the bearings during use. Although the applicant does not wish to be bound by any particular theory, it is believed that too thick of a layer of solid lubricant promotes the tendency of the layer to "plow" up in front of the advancing bearing contact surfaces and to release particles of lubricant from its surface. It is believed that such particles contribute to bearing noise and failure and cause high voltage instability in the X-ray tube. Applicant has determined that thin, highly uniform layers of lubricant decrease the effective coefficient of friction of the coated bearing by reducing plowing and decreasing the amount of bearing material debris released from the bearing. The use of ion plating directly over the substrate surface, without the use of intermediary bonding layers or surface roughening, allows precise control of the lubricant thickness. A thinner lubricant layer also reduces the lubricant deformation, incident to plowing, decreasing the effective coefficient of friction within the bearing.

Another general object of the invention is to improve the surface and physical characteristic of the lubricant layer. The plated bearing is cooled in a hard vacuum ($10^{-7}$ torr) to reduce surface oxidation which may later contribute to lubricant exfoliation. The ion plating is performed at an elevated temperature to improve the ductility of the solid lubricant layer also reducing lubricant exfoliation. The ion plating is performed in the presence of ionized argon which is believed to promote a more uniform and equiaxed plating structure by selectively removing microscopic "peaks" in the plated surface and generally dispersing the plating silver ions. The resulting uniformity both directly reduces the bearing's coefficient of friction by improving the surface contact dynamics, and indirectly reduces the bearing's coefficient of friction by reducing the specific surface area exposed to oxidation and hence the total formation of oxide particles which may exfoliate.

The foregoing and other objects and advantages of the invention will appear from the following description. In the description, reference is made to the accompanying drawings which form a part hereof and in which there is shown by way of illustration, a preferred embodiment of the invention. Such embodiment does not necessarily represent the full scope of the invention, however, and reference is made therefore to the claims herein for interpreting the scope of the invention.

BRIEF DESCRIPTION OF THE DRAWINGS

FIG. 6 is a sectional view of an x-ray view incorporating bearing elements coated according to the present invention;

FIG. 7 is a detailed sectional view of a bearing assembly for use in the x-ray tube of FIG. 6.

DESCRIPTION OF THE EMBODIMENT

Figure 1:
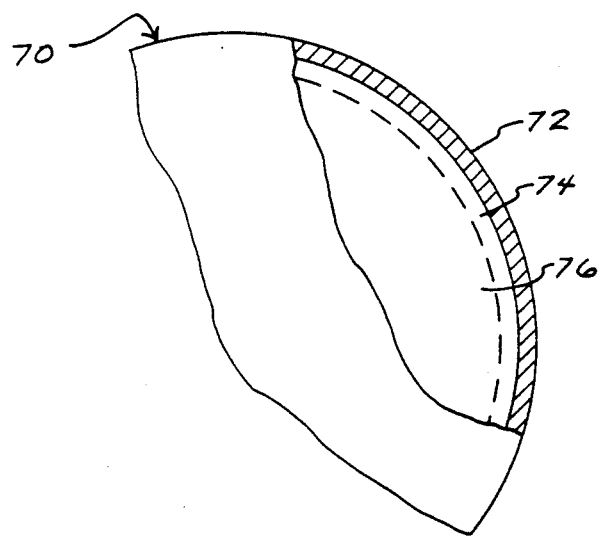
FIG. 1 is a partial sectional view of a bearing ball showing enlarged details of the solid lubricant layer and the zone of shallow ion implantation on the bearing substrate.

Referring to FIG. 1, a solid lubricant coated bearing produced according to the present invention is comprised of an outer lubricant layer 72 of silver of approximately 1000Å. This lubricant layer 72 is deposited directly on the substrate 76 whose surface 74 has been treated by shallow ion implantation as will be described below.

The bearing ball substrate is 5/32 inch in diameter manufactured to the standards of AFBMA Grade 10 with a Rockwell 45N hardness of 70–76 according to ASTM Standard E-18. The substrate material is a high speed tool steel conforming to AISI category T-15 and may be purchased under the trade name Vasco Supreme from Teledyne vasco of Latrobe Pa. It will be apparent to one skilled in the art that the the present invention may be applied to other bearing structures with rolling surfaces such as roller bearings where a cylindrical rolling element is maintained between an inner and outer race,.and that the bearing substrate may be composed of other grades of steel or alloys of comparable hardness and finish.

Lubricant Coating Equipment

Figure 3:
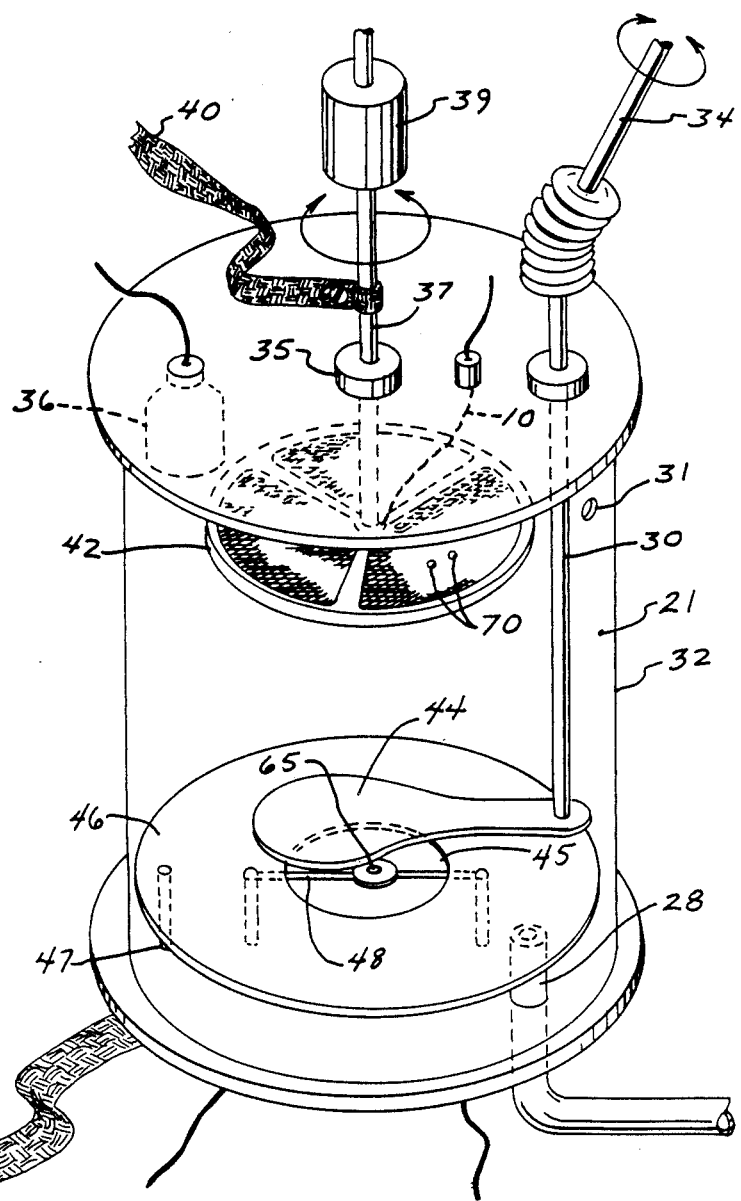
FIG. 3 is a simplified perspective view of the plasma containment cylinder of the ion plating apparatus of FIG. 2.
Figure 2:
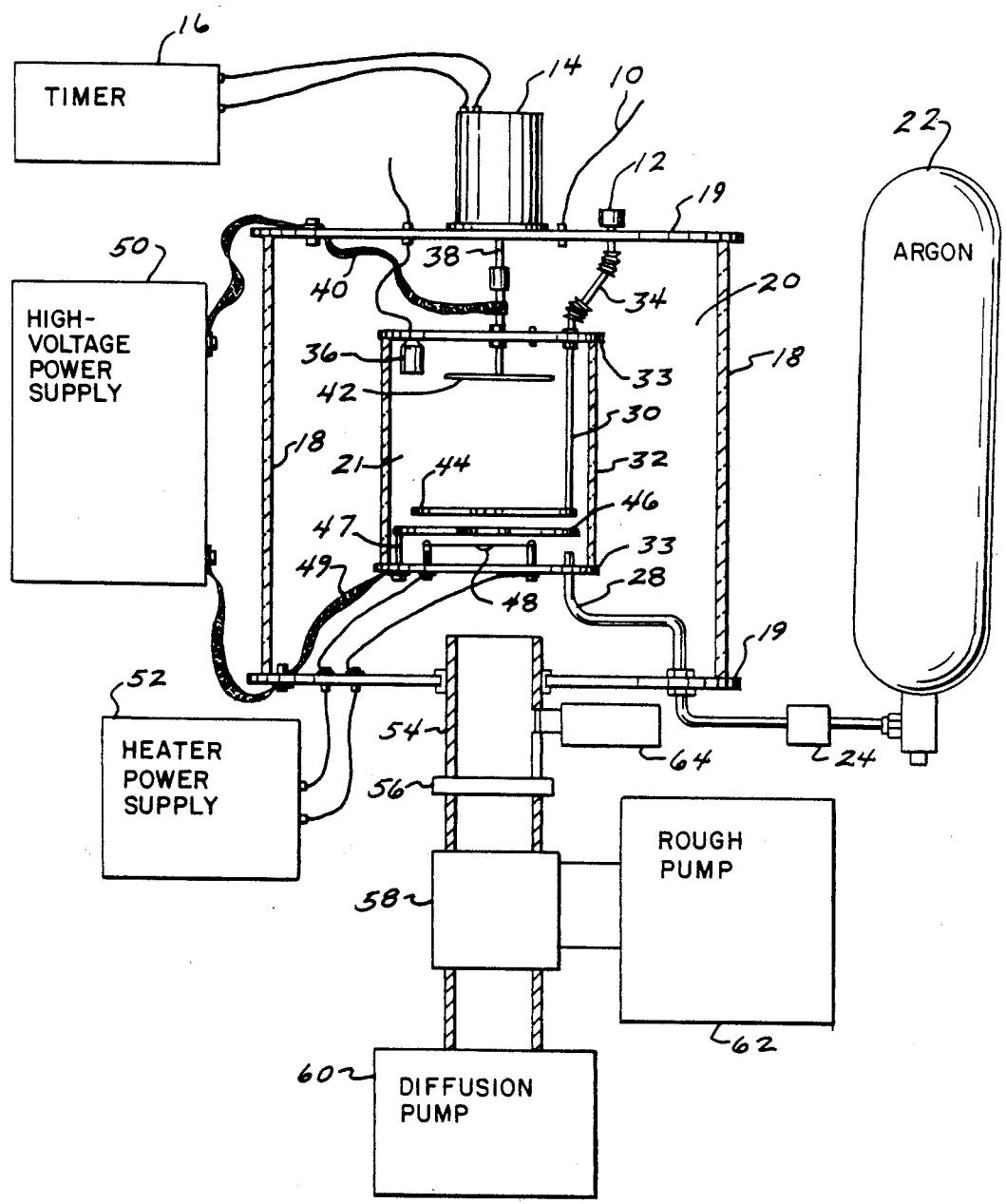
FIG. 2 is a block diagram of a ion plating apparatus suitable for use in processing the bearing ball of FIG. 1.

Referring generally to FIG. 2 and 3, a lubricant coating system suitable for use with the present invention is comprised of a hollow quartz vacuum cylinder 18 which is sealed by removable aluminum endplates 19 to form a vacuum chamber 20 that will withstand evacuation to a pressure of $10^{-7}$ torr. Mechanical shafts, electrical wires and piping, to be described below, pass through the endplates 19 by means of gas tight fittings understood in the art. The lowermost endplate 19 admits a vacuum pump throat which, by means of diverter valve 58, alternately connects to a rough pump 62 or to a diffusion pump 60. The rough pump 60 is mechanical rotary and performs the initial evacuation of the quartz vacuum cylinder from atmospheric pressure. The diffusion pump incorporating a cold trap (not shown) provides the final evacuation required to achieve a hard vacuum of approximately $10^{-7}$ torr. Attached to and communicating with the inside of the vacuum pump throat 54 is an ion vacuum gauge 62 which provides a measure of the pressures within the quartz vacuum cylinder 18. Interposed within the vacuum pump throat between the diverter valve and the lower aluminum endplate 19 is a flow throttle 56 whose operation will be described below.

Suspended within the vacuum chamber 20 is a transparent plasma containment cylinder 32 also with removable upper and lower aluminum endplates 33 which form a plasma chamber 21 within the vacuum chamber 20. The plasma containment cylinder 32 is not air-tight. When assembled with its endplates 33, gases inside the plasma chamber 21 may communicate with gases outside the plasma chamber 21 and within the vacuum chamber 20 by means of the gaps between the plasma containment cylinder 32 and its endplates 33 and by means of ports 31, the latter of which are located predominantly toward the top of the plasma chamber 21. Accordingly, gaseous argon, admitted by tube 28 though the lower endplate 33 of the plasma chamber, flows generally from the bottom to the top of the plasma chamber 21 and out into the vacuum chamber 20 through ports 31. Argon tube 28 extends through the bottom vacuum chamber endplate 19 to metering valve 24 to admit pressurized argon from argon cylinder 22.

A resistively heated boat 48, holding a small quantity of silver 65, is held above the lower endplate 33, within the plasma chamber 21. A heater power supply 52 is connected to the resistively heated boat 48 so as to provide electrical current to heat the boat and melt the silver 65 contained within the boat, as required. The temperature of the boat 48 may be raised to the melting point of the lubricant or approximately 960° C.

An auxiliary anode 46, containing an aperture 45, is positioned above the boat 48 so that the aperture 45 is centered around the silver 65. The auxiliary anode 46 is affixed to the lower endplate 33 by means of an electrically conducting standoff 47 which in turn is connected by braided anode lead 49 to the positive terminal of the high voltage power supply 50. High voltage power supply 50 is a DC power supply capable of supplying up to three thousand volts.

Above the aperture 45 of the auxiliary anode 46 is a shutter 44 affixed to shaft 30 which extents through the upper endplate 33. Shaft 30 is in turn connected to flexible shaft 34 which extends through upper endplate 19 and is terminated with knob 12. The rotation of knob 12 serves to swing shutter 44 over or away from aperture 45.

Figure 4:
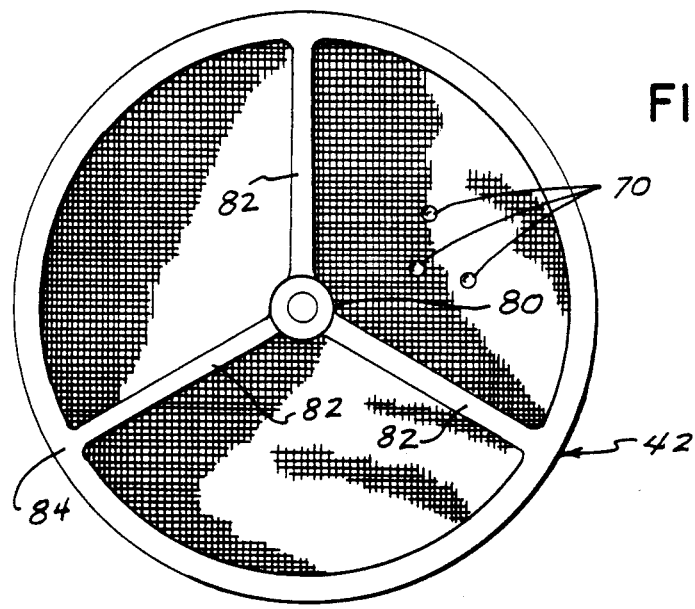
FIG. 4 is a plan view of the agitator basket held within the containment cylinder of FIG. 3 which supports the bearing balls during processing.

Four inches above the silver 65, and in direct line of sight to the silver 65 when the aperture 45 is uncovered, is agitator basket 42. Referring to FIG. 4, agitator basket 45 is comprised of an aluminum ring 84 connected by spokes 82 to a central hub 80. A silver mesh 43 of similar diameter to the ring 84 is affixed to the lower surface of the ring 84 and spokes 82 to form a shallow tray whose walls are the spokes 82, ring 84 and hub 80 and whose bottom is the mesh 43 and which together comprise the agitator basket 42. The agitator basket 42 contains the bearing balls 70 during the coating process. The mesh 43 is composed of the same material which is to be plated as solid lubricant: silver, so as to reduce surface contamination of the bearing balls 70 during the coating process.

Referring again to FIGS. 2 and 3, the agitator basket 42 is affixed to an electrically conducting vertical shaft 37 which is free to rotate and extends through the upper endplate 33 by means of insulated bushing 35 and is connected to motor shaft 38 by means of electrically isolating connector 39. Conducting shaft 37 is connected by means of braided cathode lead 40 to the negative terminal of high voltage power supply 50. Motor shaft 38 extends upward through upper endplate 19 to agitator motor 14 which is controlled by agitator timer 16. Activation of the agitator motor 14 by the agitator timer 16 results in rotary oscillation of the agitator basket 42 permitting constant relative motion between the agitator basket and the bearing balls 70 as is required to ensure even coating during the coating process.

A thermocouple 10 is attached to the agitator basket 42 to provide a measure of agitator basket 42 and bearing ball 70 temperatures during the coating process. Also, affixed to the lower surface of the upper endplate 33 is a thickness monitor 36 such as is used in the semiconductor industry for measuring metalization rates in the production of integrated circuits.

Coating Process

Figure 5:
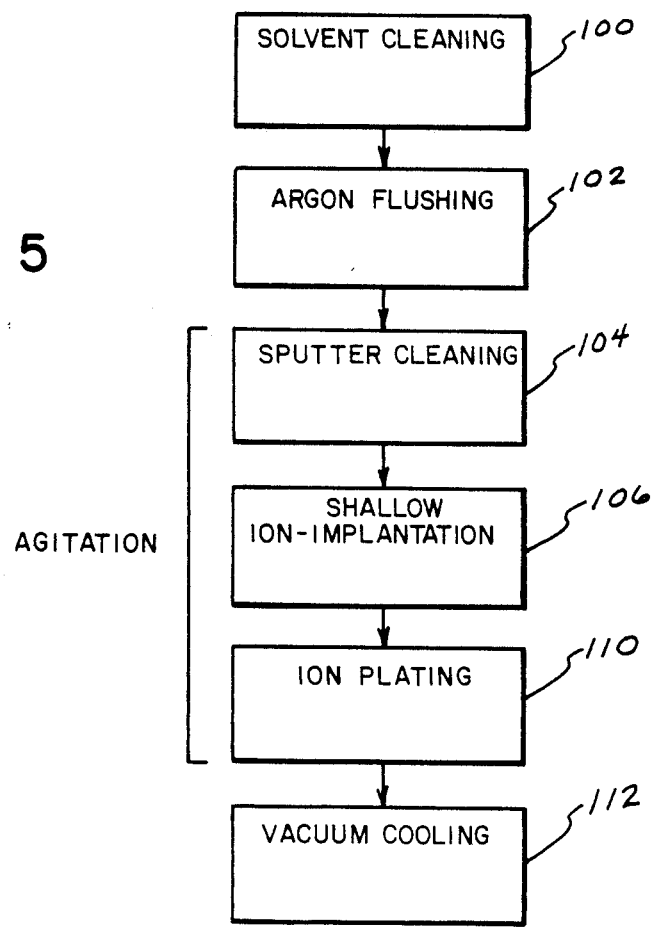
FIG. 5 is a flow chart of the bearing surface processing according to the present invention.

Referring to FIG. 5, as indicated in process block 100, the bearing balls 70 are first solvent cleaned in successive ultrasonically agitated baths of alcohol and methylene chloride to remove the instrument oil with which the bearings are coated by the manufacturer. The bearings are then air dried and place in the agitator basket 42 within the plasma chamber.

The vacuum chamber 20 and plasma chamber 21 are then evacuated to $10^{-7}$ torr, filled with high purity argon to atmospheric pressure, and then evacuated again to $10^{-7}$ torr as indicated in process block 102. The purpose of this procedure is to eliminate, to the extent feasible, stray gas molecules such as nitrogen and oxygen which could combine with the final silver coating to form oxides and nitrites reducing the silver coating's lubricity.

The agitator timer 16 is activated, oscillating the agitator basket so as to provide uniform processing of the bearing balls 70 during the sputter cleaning process indicated by process block 104. At this time high purity gaseous argon is introduced to the plasma chamber 21 raising the pressure to approximately 21 $\mu$m of Hg. The flow throttle 56 in the vacuum pump throat 54 prevents saturation of the diffusion pump with the introduced argon stream. The high voltage power supply 50 is set to a voltage of 2.5 to 2.8 kvolts creating a high voltage electric field between the auxiliary anode 46 and the agitator basket 42 and bearing balls 70. Argon atoms flowing within this field are ionized and the resulting charged argon ions are accelerated by the electric field toward the agitator basket 42 striking it and the bearing balls 70. The effect of the high velocity argon ions striking the bearing balls 70 is two fold: (1) surface impurities are cleaned from the bearing balls 70, and (2) the temperature of the bearing balls 70 is increased. This sputter cleaning process, indicated by process block 104, is continued for 3–5 minutes at which time the bearing balls temperature has risen to approximately 200–250° C. The duration of the sputter cleaning is critical to the process. Too little cleaning and surface impurities remain to decrease the adhesion of the subsequently applied solid lubricant. Too much cleaning and the surface begins to pit, decreasing the ultimate smoothness of the coated bearing surface. Within this range, the timing of the sputter cleaning process 104 may be adjusted to control the temperature of the bearing balls 70 to be approximately 200° C. during the subsequent plating process. During the sputter cleaning process 104, shutter 44 is placed over the anode aperture 45 and the resistance heated boat 48 is heated to a temperature just under the melting point of the contained silver 65.

The voltage of the high voltage power supply 50 is increased to 2.8 to 3.0 kvolts to begin the shallow implantation of silver ions, as indicated in process block 106. This step 106 and the next step 110 should proceed immediately after the sputter cleaning 104 to reduce the possibility of chemical reaction of the bearing ball activated surfaces with contaminates. The voltage applied to the resistance heated boat 48 is now increased to uniformly melt the contained silver 65. The shutter 44 is rotated to expose the aperture 45 and the silver 65. Evaporating silver atoms may now flow into the space between the auxiliary anode 46 and the agitator basket 42 where they are ionized and accelerated against the bearing balls 70. The anode to cathode voltage is sufficient to implant the accelerating silver ions within the surface of the bearing balls 70. It is believed that the silver ions thus implanted are maintained within a few atomic radius's of the surface of the bearing balls forming a shallow ion implantation layer 74.

The shallow implantation 106 is continued for 0.5 to 1 minute at which time the voltage is lowered to 2.0 to 2.2 kvolts to begin the plasma assisted ion plating as indicated at process block 110. As mentioned, the period of time of the sputter cleaning process 104 may be adjusted slightly so that the bearing balls 70 are at approximately 200° at the time of plating. This temperature promotes an equiaxed plating structure which improves the lubricity of the lubricant coating. During the plating process, the pressure is maintained, as is steps 104 and 106, at 18–21 μm.

The plating process typically requires approximately 0.5–3 minutes however there may be some variation in deposition rate depending on the equipment's ability to maintain the plating parameters constant. Accordingly, the plating is continued until a layer of approximately 850–1150 Å is obtained as may be indirectly monitored by the thickness gauge 36. The ion plated layer 72 so produced may have a uniformity to within ±100 Å. The plating process produces a plated layer of substantially pure solid lubricant.

At the conclusion of the ion plating process 110, the agitator timer 16 is turned off, and the plating chamber is again evacuated to $10^{-7}$ torr, as indicated at process block 112. The bearing balls 70 are allowed to cool to room temperature under vacuum to prevent the formation of oxides and nitrites which formation would be accelerated at the high plating temperatures.

X-ray Tube

Once cool the bearing balls 70 may contact the air for a limited period of time during their assembly into X-ray tubes. Referring to FIG. 7, bearing balls 70 are assembled into bearings 150 comprised of an outer grooved race 162 and an inner grooved race 164. The inner grooved race 164 is split into two equal halves along its circumferential groove to permit the insertion of twelve bearing balls 70 into the races 162 and 164. The inner and outer races 162 and 164 are constructed of high speed tool steel Referring to FIG. 6, a bearing 150 is placed on either end of the bearing shaft 158. A molybdenum spring 161 presses against front and rear bearing retainers 163 which seat against the outer bearing races 162 to provide the assembled bearings 150 with axial preload.

One end of the bearing shaft 158 is rigidly affixed to the center of a disk shaped anode 156 and also to a tubular copper rotor sleeve 160 which surrounds the length of the bearing shaft 158 and serves as an armature for an induction motor (not shown) which provides torque to the bearing shaft 158 and which thereby spins the anode 156 This entire anode assembly is contained in a glass envelope 154 which may be evacuated to $10^{-9}$ torr. Directed toward the surface of the anode 156 and also within the glass envelope 154 is a cathode 152 which emits a stream of high energy electrons toward the face of the spinning anode 156 as is understood in the art.

In the example described, the solid lubricant silver was applied solely to the rolling surface of a bearing balls and not to the surface of either of the races. However the rolling surfaces of either or both of the races may be coated in addition to or in lieu of the coating on the bearing ball provided the combined lubricant layer between any two contacting surfaces is maintained to approximately 700–1500 Å

It should be further noted that although the application of solid lubricant has been discussed in the context of the creation of bearings for X-ray tubes, such techniques are equally applicable to the creation of bearings for other demanding environments such as for use in a space power reactor (SP-100) where organic lubricants are infeasible either because of low pressures or high temperatures generated within the bearing systems.

A preferred embodiment of the invention has been described, but it should be apparent to those skilled in the art that many variations can be made without departing from the spirit of the invention. For example the shallow ion implantation technique may be used with other solid lubricants, such as gold and lead, to improve adherence and reduce lubricant exfoliation. Also, other inert gases such as Helium may be used in place of the Argun for sputtering and to assist the coating process.

I claim:

1. An x-ray tube comprising:
   an evacuated envelope;
   an anode and cathode contained within said envelope;
   a bearing means of supporting said anode, said bearing means including a bearing substrate material with an implantation layer of solid lubricant implanted in the substrate material to a depth of at least 2 atomic diameters beneath the surface of said substrate said implantation layer covered by an ion plated layer plated by plasma assisted ion plating with a layer of solid lubricant.

2. A bearing comprised of adjacent bearing elements composed of a substrate material with contacting rolling surfaces wherein one or more bearing elements has an ion plated layer of solid lubricant plated on the outer surface of an implantation layer of solid lubricant implanted to a depth of at least two atomic diameters beneath the surface of the substrate, the implantation layer comprising both solid lubricant and substrate material.

3. The bearing of claim 2 wherein the solid lubricant is selected from the group consisting of Ag, Au, Pb, In and Sn and the thickness of the ion plated layer measured between any two contacting rolling surfaces is greater than 750 Å and less than 1600 Å.

* * * * *